United States Patent
Schramek et al.

(10) Patent No.: US 7,810,940 B2
(45) Date of Patent: Oct. 12, 2010

(54) ADJUSTABLE TABLE FOR SHAPING A MIRROR

(75) Inventors: Philipp Hans Josef Schramek, Starnberg (DE); Anthony John Roddom, Branxton (AU)

(73) Assignee: Areva Solar, Inc., Mountain View, CA (US)

( * ) Notice: Subject to any disclaimer, the term of this patent is extended or adjusted under 35 U.S.C. 154(b) by 0 days.

(21) Appl. No.: 12/132,560

(22) Filed: Jun. 3, 2008

(65) Prior Publication Data

US 2009/0296245 A1     Dec. 3, 2009

(51) Int. Cl.
*G02B 7/182* (2006.01)
(52) U.S. Cl. ........................ 359/881; 359/853
(58) Field of Classification Search ......... 359/846–849, 359/868, 869, 871, 883, 881, 853
See application file for complete search history.

(56) References Cited

U.S. PATENT DOCUMENTS

| | | | |
|---|---|---|---|
| 2,410,888 A * | 11/1946 | Lucy | 264/219 |
| 4,238,265 A | 12/1980 | Deminet | |
| 4,239,344 A | 12/1980 | Wildenrotter | |
| 4,268,332 A | 5/1981 | Winders | |
| 4,331,383 A * | 5/1982 | Christiansen | 359/848 |
| 4,422,893 A | 12/1983 | Duchateau et al. | |
| 4,468,848 A | 9/1984 | Anderson et al. | |
| 4,574,457 A * | 3/1986 | Farnum, III | 29/469.5 |
| 4,684,113 A * | 8/1987 | Douglas et al. | 269/21 |
| 4,731,144 A * | 3/1988 | Kommineni et al. | 156/245 |
| 5,364,083 A * | 11/1994 | Ross et al. | 269/21 |
| 5,411,617 A * | 5/1995 | La Fiandra | 156/154 |
| 6,453,544 B2 * | 9/2002 | Cioletti et al. | 29/721 |
| 7,240,675 B2 | 7/2007 | Eickhoff | |
| 2009/0260753 A1 | 10/2009 | Selig et al. | |

FOREIGN PATENT DOCUMENTS

| | | |
|---|---|---|
| EP | 1764565 B1 | 3/2007 |
| GB | 2268699 A * | 1/1994 |
| WO | 2008092194 A1 | 8/2008 |
| WO | 2008092195 A1 | 8/2008 |

OTHER PUBLICATIONS

English Translation of European Patent Application No. EP 1 764 565 A1, entitled "Process for Manufacturing an Optical Mirror," Publication Date: Mar. 21, 2007, 13 pages.

* cited by examiner

*Primary Examiner*—Euncha P Cherry
(74) *Attorney, Agent, or Firm*—Patent Law Group LLP; Rachel V. Leiterman

(57) ABSTRACT

A table comprising a base and a plurality of support members supported by the base is used to shape a mirror. The height of the plurality of support members is adjusted to form a predetermined shape. A mirror is placed over the plurality of support members, such that the mirror assumes the predetermined shape. A frame is then attached to the mirror such that when the mirror and frame are lifted off the table, the mirror substantially retains the predetermined shape.

10 Claims, 5 Drawing Sheets

ADJUSTABLE TABLE FOR SHAPING A MIRROR

BACKGROUND

Solar power may be used to produce electricity by using mirrors to concentrate solar radiation on one or more receivers. In some examples, the sunlight heats a fluid in the receivers, producing a high pressure gas either directly by boiling the fluid, or indirectly by running the heated fluid through one or more heat exchangers to produce a high pressure gas, such as steam. The gas turns one or more turbines which power electrical generators. In other examples, the receiver includes one or more photovoltaic devices that absorb concentrated sunlight and directly generate electricity.

The mirrors used in such arrangements are often curved. Curved mirrors are conventionally formed by bending a mirror over a shaped form or mold, then gluing or otherwise attaching a support frame to the mirror, such that the mirror retains the shape of the form or mold after being attached to the frame. Forming mirrors by this technique is described in, for example, U.S. Pat. Nos. 4,268,332 and 4,239,344. The shape of the form or mold is fixed. In order to change the shape of the mirror, a new form or mold must be constructed.

SUMMARY

In accordance with embodiments of the invention, a table for shaping a flat or curved mirror is adjustable. In a method according to embodiments of the invention, a table for shaping a mirror comprises a base and a plurality of support members supported by the base. The height of the plurality of support members is adjusted to form a predetermined shape. A mirror is placed over the plurality of support members, such that the mirror assumes the predetermined shape. A frame is then attached to the mirror in such a way that when the mirror and frame are lifted off the table, the mirror substantially retains the predetermined shape.

In some embodiments, the support members are rods (e.g., threaded rods, unthreaded rods, bolts) or pins passed through holes formed in the base. The height of the support members may be adjusted to form a predetermined shape that is flat, or curved in one, two, or more directions. In some embodiments, a plurality of parallel beams are disposed over and connected to the support members. The height of the beams may be adjusted to form a predetermined shape that is curved in one direction. In some embodiments, a sheet of flexible material is disposed over the plurality of support members.

DETAILED DESCRIPTION

Figure 1:
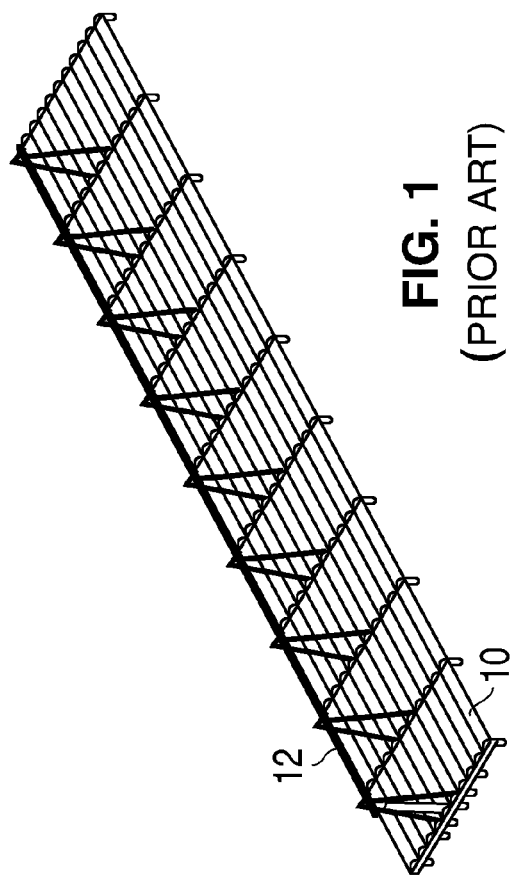
FIG. 1 illustrates an array of linear Fresnel reflectors concentrating solar radiation on an overhead pipe receiver.
Figure 2:
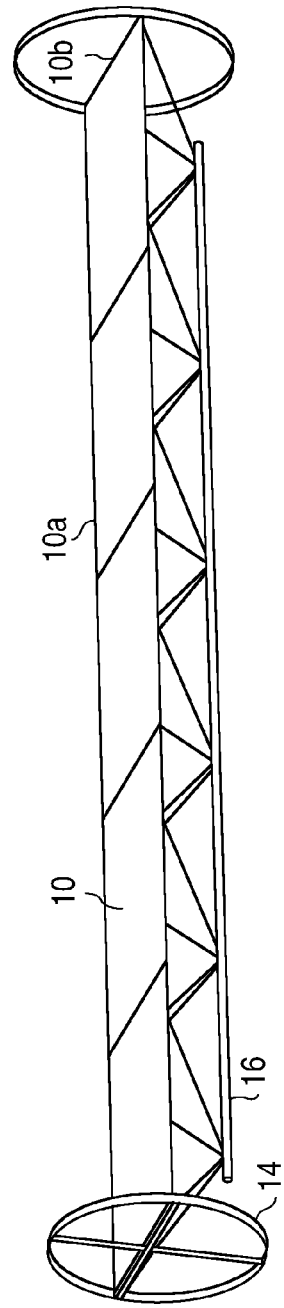
FIG. 2 illustrates a single linear Fresnel reflector.

The mirrors in a solar array may be configured to focus solar radiation on a line, such as an array of linear Fresnel reflectors as illustrated in FIG. 1. Reflectors 10 follow the path of the sun and reflect solar radiation on to one or more receivers 12 disposed over the mirrors. FIG. 2 illustrates a single mirror 10. The long side 10a of mirror 10 may have a length between 10 and 20 meters, and the short side 10b may have a length between 1 and 4 meters. The mirror may be divided into segments, each segment having a length between 1 and 5 meters. Mirrors 10 may be substantially flat, or curved along short axis 10b and substantially flat along long axis 10a. In the illustrated example, hoops 14 on either end of mirror 10 rest on bearings and can tilt the mirror around long axis 10a to follow the path of the sun but other mounting and pivoting methods are known. The radius of curvature of the curved short side may be between 20 and 40 meters.

Figure 4:
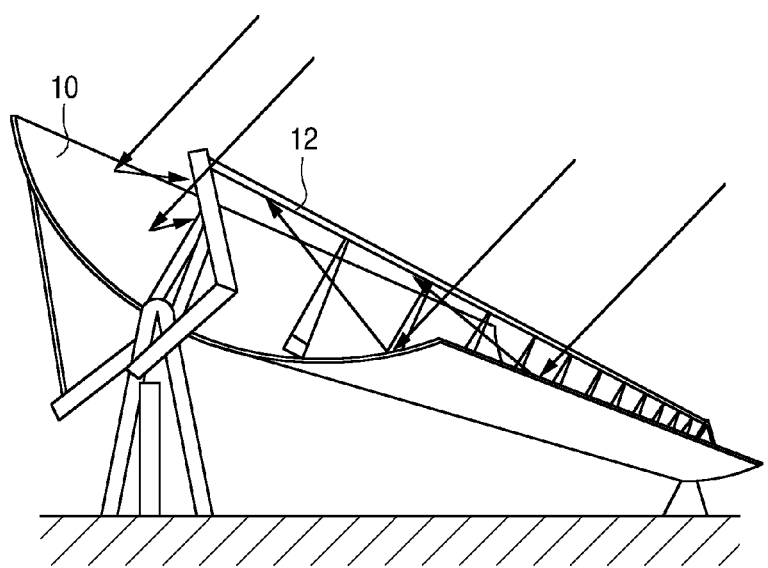
FIG. 4 illustrates a parabolic reflector.

The array illustrated in FIG. 1 is generally arranged such that several mirrors focus solar radiation on a single overhead receiver. In a parabolic reflector, as illustrated in FIG. 4, a single parabolic mirror 10 focuses solar radiation on a single receiver 12 disposed within the reflector.

Figure 3:
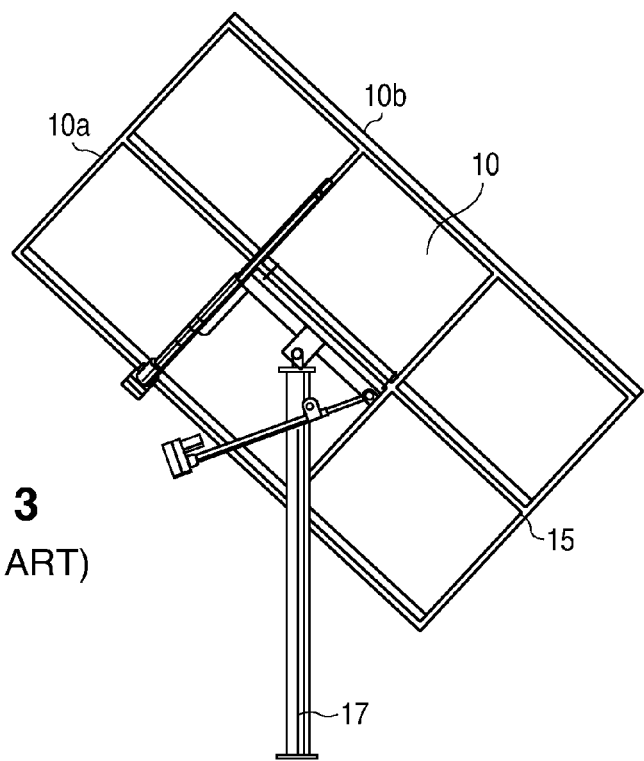
FIG. 3 illustrates a heliostat adjustable about 2 axes.

Both the linear Fresnel reflectors and the parabolic reflectors described above focus solar radiation on a line. Alternatively, the mirrors may be configured to focus solar radiation on a small (e.g., point-like) area. An array of such mirrors, referred to herein as heliostats, may be arranged to concentrate solar radiation on a receiver tower. FIG. 3 illustrates the back side of a heliostat. A mirror 10 is mounted on frame 15. Frame 15 is mounted on support 17. Frame 15 can pivot around support 17, and tilt up or down to follow the path of the sun. The mirror mounted on frame 15 can be substantially flat, curved along one of axis 10a or axis 10b and substantially straight along the other axis, or curved along both axes 10a and 10b.

Embodiments of the invention are directed to tables for forming flat or curved mirrors such as the mirrors in the devices described above. In accordance with embodiments of the invention, a table for forming a flat or curved mirror includes a plurality of support members whose height may be adjusted. The same table may be used to form mirrors with different shapes, by adjusting the height of the support members.

Figure 5:
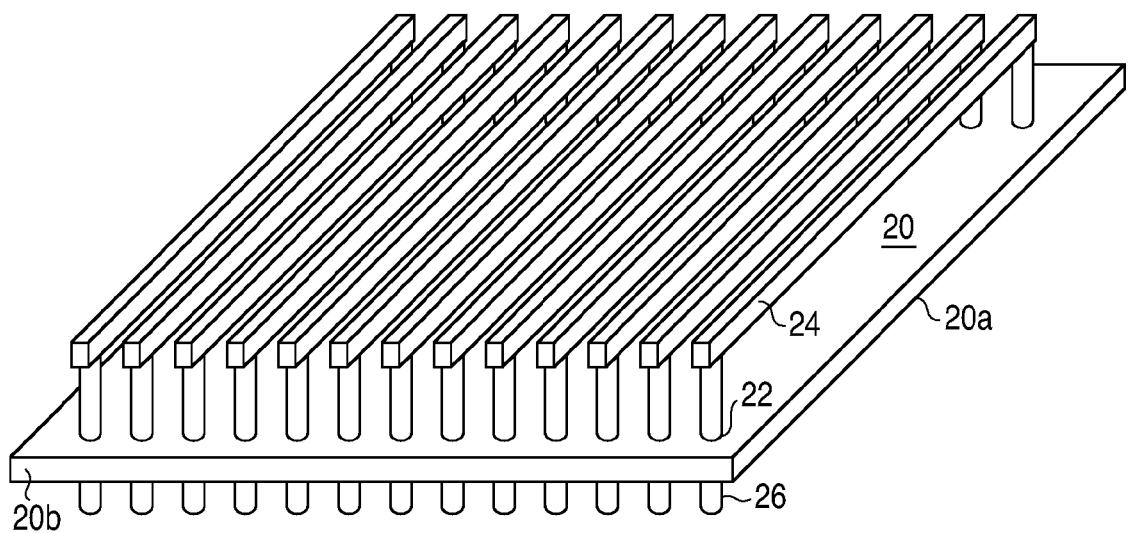
FIG. 5 illustrates a table for forming a mirror that is flat or curved in one direction.
Figure 6:
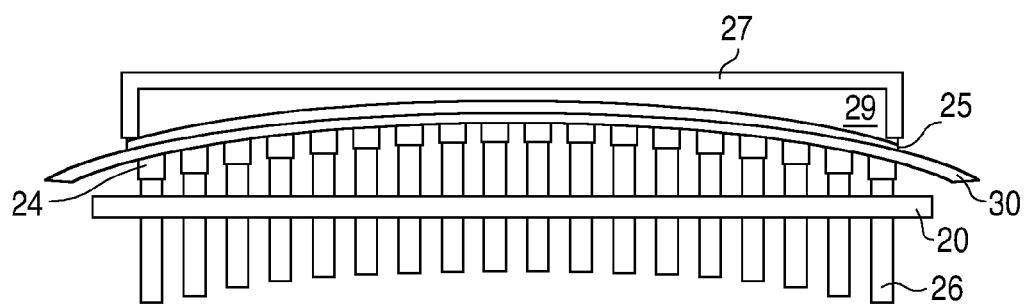
FIG. 6 is a side view of a table of the type illustrated in FIG. 5.

FIG. 5 illustrates a table for forming a mirror curved in one direction. FIG. 6 is a side view of the type of table illustrated in FIG. 5. The table includes a base 20. Base 20 may be made from any suitably stiff material, such as wood, plastic, or metal such as steel. Though the base illustrated in FIG. 5 is a single, continuous piece of material, it need not be. For example, in the table illustrated in FIG. 5, the portion of base 20 between front supports 26 and back supports 26 may be omitted. Base 20 is generally about the size of the reflector to be formed. If base 20 is used as a reference for setting the height of supports 26, base 20 may be flat, or the shape of base 20 must be known. If base 20 is not used as a reference for setting the height of supports 26, base 20 need not be completely flat.

A plurality of beams 24 are disposed over the base 20 and attached to supports 26. An optional sheet 30, shown in FIG. 6, may be placed over beams 24. The mirror 25 is placed reflective side down on beams 24 or optional sheet 30, and assumes the shape created by the plurality of beams or the sheet, for example by the force of gravity or by application of an additional force. A frame 27 is then attached to the mirror. For example, frame 27 may be flat, and the area 29 between frame 27 and mirror 25 may be filled with, for example, glue and spacers necessary to support mirror 25, such that when the finished structure (mirror plus frame) is removed from the table, the mirror retains the shape created by the plurality of beams or the sheet attached to the tops of the beams. The mirror is curved along axis 20b, and flat along axis 20a.

The height of each beam 24 may be adjusted by adjusting supports 26. In some embodiments, supports 26 are threaded rods such as bolts passed through holes 22 formed in base 20. Holes 22 may be threaded or smooth. One or more nuts may be threaded on each bolt and placed in contact with the bottom side, the top side, or both the top and bottom sides of base 20. The height of a beam can be adjusted by turning a nut to raise or lower the support. Other adjustable supports besides bolts may be used, such as pins friction-fit into holes in base 20 and adjusted by hand or by an actuator, or clamped to base 20; linear actuators, which may be threaded or not, passed through holes in base 20; or telescoping pins that are connected to the top of base 20 or passed through holes in base 20.

Beams 24 may be any suitable material that does not deform significantly under the weight of sheet 30 or of the mirror and frame. For example, beams 24 may be rectangular tubes or c-shaped beams of steel or aluminum. In the table illustrated in FIG. 5, there are two supports for each beam, one at each end of the beam. More or fewer supports may be used, depending on the length and weight of each beam. In some embodiments, each beam is supported by three supports, one at each end of the beam as illustrated in FIG. 5, and one at the center of each beam.

Though 13 beams are shown in FIGS. 5 and 18 beams are shown in FIG. 6, it is to be understood that more or fewer beams may be used. The number of beams 24 and the space between neighboring beams depends on the size and the desired shape of the mirror shaped by the table. A mirror with an area between one and 150 m² may have a radius of curvature on the order of hundreds of meters. To shape such a mirror, the tops of the beams at the center of the table may be millimeters higher than the tops of the beams at the edges of the table. Beams may be spaced on the order of centimeters or tens of centimeters apart. More beams spaced more closely together may be required to shape a mirror with a smaller radius of curvature. In some embodiments, the beams may be aligned with beams on the frame to which the mirror is attached after being shaped by the table, such that any force applied by placing the frame over the mirror or attaching the frame to the mirror is opposed by a beam on the table. If no sheet 30 (described below) is used, the beams may be coated or topped with a material that will not damage the mirror, such as, for example, smooth plastic.

Sheet 30 may be any material that is flexible enough to assume the shape of beams 24, that will not significantly compress under the weight of the mirror, that will not significantly sag under its own weight or the weight of the mirror, and that will not damage the mirror. Suitable materials include particle board or plastic such as HDPE. Sheet 30 may be, for example, between 5 and 20 mm thick in some embodiments, and between 10 and 15 mm thick in some embodiments. A gap in sheet 30 may be aligned with supports 26, to allow access to the supports for adjusting the height of beams 24. For example, in embodiments where each beam is supported by three supports, a gap in sheet 30 may be aligned with the center support. In some embodiments, sheet 30 may be attached to some beams by a mechanism that permits sheet 30 to be removed or placed to the side to adjust supports 26, then replaced after the adjustment.

Figure 7:
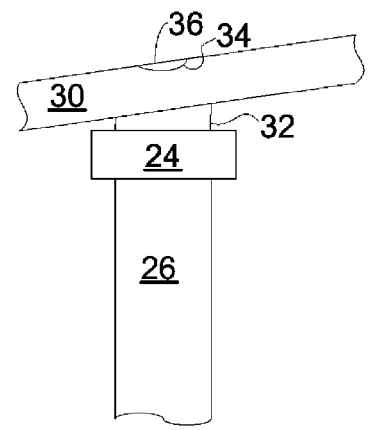
FIG. 7 illustrates a sheet fastened to a support via a flexible member.

FIG. 7 illustrates sheet 30 attached to a beam 24. The top of beam 24 may be, for example, centimeters wide. Sheet 30 may be connected to beams 24 by, for example, glue, nails, staples, screws, or any other suitable fastener 36. A flexible member 32 such as, for example, a strip of rubber with a width on the order of a few centimeters and a thickness on the order of a few millimeters, is glued to the top of beam 24 between sheet 30 and beam 24. Without member 32, the sheet may be forced to take the flat shape of the top of beam 24 when the fastener connecting sheet 30 to beam 24 is applied. Member 32 deforms when sheet 30 is fastened to beam 24, such that sheet 30 has a smooth curved surface as illustrated in FIG. 6, rather than a curved surface interrupted by flat sections where fasteners 36 attach the sheet to the beams. Depending on the fasteners 36 used, notches or recesses 34 may be formed in sheet 30 where the fasteners are placed, such that the fasteners 36 are flush with the smooth top surface of sheet 30 when the sheet fastened to beams 24.

Figure 11:
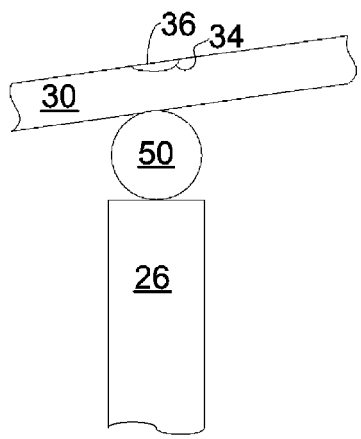
FIG. 11 illustrates a sheet fastened to a support via a structure with a circular cross section.

Alternatively, beam 24 and flexible member 32 may be replaced by a structure 50 with a circular cross section, such as a plastic or metal rod or a tube, fastened to the top of support 26, as illustrated in FIG. 11. Alternatively, the top of support 26 may be formed with a semi-circular cross section. Sheet 30 contacts structure 50 at a line along the top of structure 50. Sheet 30 may be fastened to structure 50 by a fastener 36, such as a screw passing through a hole in structure 50.

In some embodiments sheet 30 is not fastened to supports 26, beams 24, or structures 50. In some embodiments, sheet 30 is fastened to only some of supports 26, beams 24, or structures 50. If the shape created by sheet 30 is substantially changed, in some embodiments sheet 30 is removed from the table and replaced, to prevent warping of the sheet caused by changing the height of supports 26. In some embodiments, holes in sheet 30 through which fasteners are passed may be larger than the fasteners, such that sheet 30 can slide across the supports as the height of the supports is changed.

Figure 8:
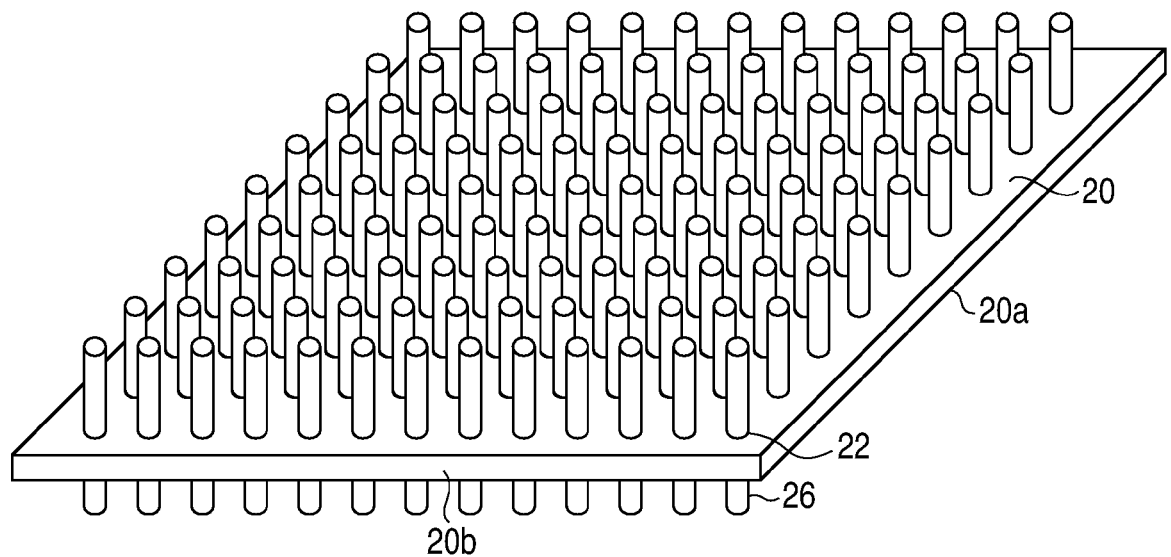
FIG. 8 illustrates a table for forming a mirror that is flat or curved in one, two, or more directions.
Figure 9:
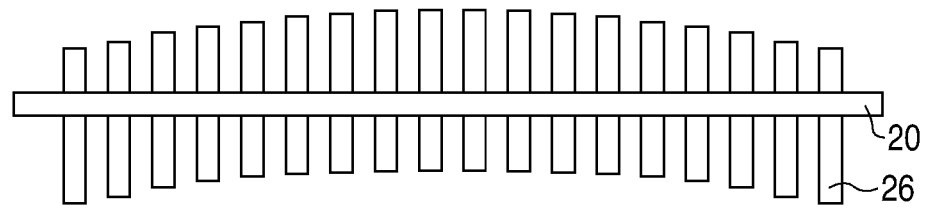
FIG. 9 is a side view of a table of the type illustrated in FIG. 8.

FIG. 8 illustrates a table for forming a mirror that is flat or curved in one, two, or arbitrary directions. FIG. 9 is a side view of the type of table illustrated in FIG. 8. Like the table illustrated in FIGS. 5 and 6, the table of FIGS. 8 and 9 includes a base 20. Supports 26 form the surface that shapes the mirror. Supports 26 can be adjusted such that the mirror is curved along both axis 20a and axis 20b. Supports 26 may be, for example, any of the structures described above in the text accompanying FIGS. 5 and 6. Though a 13×9 array of supports is illustrated in FIGS. 8 and 18 supports are illustrated in FIG. 9, it is to be understood that more or fewer supports may be used. In addition, though the supports are shown arranged in a square lattice, other arrangements may be used. If a sheet 30 (FIG. 6) is used over supports 26 to shape a mirror that is curved in two or more directions, the sheet must be flexible enough to stretch over supports 26 without warping. Suitable materials include, for example, rubber. If no sheet 30 is used, supports may be coated or topped with a material that will not damage the mirror, such as, for example, smooth plastic.

Figure 10:
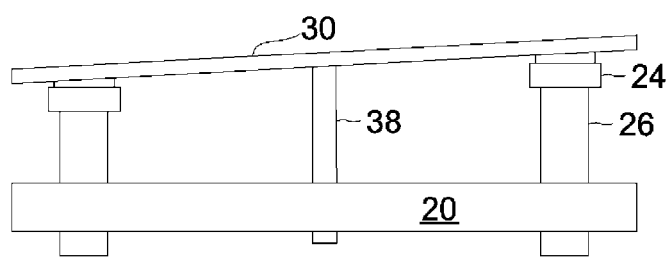
FIG. 10 is a side view of a portion of a table including measuring devices.

In some embodiments, the table may include one or more measuring devices to confirm the height of the supports. FIG. 10 is a side view of a portion of a table including measuring devices. Measuring device 38 may be placed between neighboring supports 26. Measuring device 38 may be, for example, a ruler fixed to sheet 30 or another structure. Measuring device 38 may pass through a hole in base 20. The ruler indicates the height of sheet 30 relative to base 20. The accuracy of a ruler measuring device is determined by how flat base 20 is; if base 20 is curved, setting the height of supports 26 based on ruler measuring devices will replicate the curve in base 20. Alternatively, measuring devices 38 may be sensors that indicate how much sheet 30 is moved up or down, mechanical devices such as dial indicators or other devices that indicate the height of supports 26 relative to each other or to a reference other than base 20. Though measuring device 38 is shown centered between two supports, it is to be understood that measuring device may be located anywhere, including immediately adjacent a support, or on or within a support.

The tables illustrated in FIGS. 2-7 may be adjusted to change the shape of the mirror being built. Both short and long focal length mirrors may be shaped by the tables described above, by appropriate adjusting the heights of the supports.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method of shaping a mirror, using a table comprising a base, a plurality of support members supported by the base, and a measuring device, the method comprising:
    adjusting a height of the plurality of support members to form a predetermined shape;
    placing a mirror over the plurality of support members, such that the mirror assumes the predetermined shape;
    confirming a height of one of the mirror and at least one of the support members using the measuring device; and
    attaching a frame to the mirror such that when the mirror and frame are lifted off the table, the mirror substantially retains the predetermined shape.

2. The method of claim 1 wherein the table further comprises a plurality of beams connected between support members.

3. The method of claim 1 wherein the support members are threaded rods passed through holes formed in the base.

4. The method of claim 3 wherein adjusting a height of a support member comprises turning a nut, wherein the nut is positioned in direct contact with the base and wherein the threaded rod is passed through the nut.

5. The method of claim 1 wherein the table further comprises a structure having a circular or semi-circular cross section disposed on a top of a support member.

6. The method of claim 1 wherein:
    the table further comprises a sheet of flexible material disposed over the plurality of support members; and
    placing a mirror over the plurality of support members comprises placing a mirror over the sheet of flexible material.

7. The method of claim 6 wherein the table comprises a plurality of deformable members disposed between the support members and the sheet of flexible material.

8. The method of claim 6 wherein the table comprises at least one fastener connecting the sheet of flexible material to at least one support.

9. The method of claim 1 wherein:
    the table further comprises a measuring device; and
    the method further comprises the measuring device verifying a height of a surface on which the mirror is placed.

10. The method of claim 1 further comprising applying a force on the mirror additional to the force of gravity to force the mirror to assume the predetermined shape.

* * * * *